(12) United States Patent
Xue et al.

(10) Patent No.: US 11,374,170 B2
(45) Date of Patent: Jun. 28, 2022

(54) METHODS TO FORM TOP CONTACT TO A MAGNETIC TUNNEL JUNCTION

(71) Applicant: Applied Materials, Inc., Santa Clara, CA (US)

(72) Inventors: Lin Xue, San Jose, CA (US); Jaesoo Ahn, San Jose, CA (US); Hsin-wei Tseng, San Jose, CA (US); Mahendra Pakala, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/141,470

(22) Filed: Sep. 25, 2018

(65) Prior Publication Data

US 2020/0098981 A1 Mar. 26, 2020

(51) Int. Cl.
*H01L 43/12* (2006.01)
*H01L 43/10* (2006.01)

(52) U.S. Cl.
CPC .............. *H01L 43/12* (2013.01); *H01L 43/10* (2013.01)

(58) Field of Classification Search
None
See application file for complete search history.

(56) References Cited

U.S. PATENT DOCUMENTS

| | | | |
|---|---|---|---|
| 6,051,304 A * | 4/2000 | Takahashi | G11B 5/3903 428/811.3 |
| 6,153,443 A | 11/2000 | Durlam et al. | |
| 6,713,802 B1 | 3/2004 | Lee | |
| 6,723,598 B2 | 4/2004 | Lim et al. | |
| 6,734,079 B2 | 5/2004 | Huang et al. | |
| 6,780,652 B2 | 8/2004 | Lee | |
| 6,806,096 B1 * | 10/2004 | Kim | H01L 43/12 257/E27.005 |

(Continued)

FOREIGN PATENT DOCUMENTS

| | | |
|---|---|---|
| JP | 2007158336 A | 6/2007 |
| KR | 20110002868 A | 1/2011 |
| KR | 20140111508 A | 9/2014 |

OTHER PUBLICATIONS

PCT Notification of Transmittal of the International Search Report and the Written Opinion of the International Searching Authority for International Application No. PCT/US2019/048134; dated Dec. 13, 2019; 11 total pages.

*Primary Examiner* — Andres Munoz
(74) *Attorney, Agent, or Firm* — Patterson + Sheridan, LLP (57) ABSTRACT

Embodiments of the disclosure relate to methods for fabricating structures used in memory devices. More specifically, embodiments of the disclosure relate to methods for fabricating MTJ structures in memory devices. In one embodiment, the method includes forming a MTJ structure, depositing an encapsulating layer on a top and sides of the MTJ structure, depositing a dielectric material on the encapsulating layer, removing the dielectric material and the encapsulating layer disposed on the top of the MTJ structure by a chemical mechanical planarization (CMP) process to expose the top of the MTJ structure, and depositing a contact layer on the MTJ structure. The method utilizes a CMP process to expose the top of the MTJ structure instead of an etching process, which avoids damaging the MTJ structure and leads to improved electrical contact between the MTJ structure and the contact layer.

12 Claims, 8 Drawing Sheets

(56) References Cited

U.S. PATENT DOCUMENTS

| | | |
|---|---|---|
| 6,984,530 B2 | 1/2006 | Lee et al. |
| 7,635,884 B2 | 12/2009 | Gaidis et al. |
| 8,164,128 B2 * | 4/2012 | Kanakasabapathy ............... H01L 21/76897 257/295 |
| 8,535,952 B2 * | 9/2013 | Ranjan ............... G11C 11/16 438/3 |
| 8,569,849 B2 | 10/2013 | Huang et al. |
| 8,574,928 B2 | 11/2013 | Satoh et al. |
| 8,710,605 B2 * | 4/2014 | Takahashi ............... H01L 43/12 257/427 |
| 8,841,739 B2 | 9/2014 | Khalili Amiri et al. |
| 8,847,338 B2 | 9/2014 | Assefa et al. |
| 8,912,012 B2 * | 12/2014 | Li ............... H01L 43/12 257/E21.665 |
| 8,952,350 B2 * | 2/2015 | Murase ............... H01L 45/08 257/4 |
| 9,082,695 B2 | 7/2015 | Satoh et al. |
| 9,343,659 B1 | 5/2016 | Lu et al. |
| 9,490,164 B1 * | 11/2016 | Engelmann ....... H01L 21/76829 |
| 9,564,582 B2 | 2/2017 | Pakala et al. |
| 9,660,179 B1 | 5/2017 | Annunziata et al. |
| 10,003,014 B2 * | 6/2018 | Gaidis ............... H01L 43/08 |
| 2001/0020884 A1 * | 9/2001 | Araki ............... B82Y 10/00 336/200 |
| 2005/0214953 A1 * | 9/2005 | Lee ............... H01L 27/222 438/3 |
| 2007/0215911 A1 * | 9/2007 | Torng ............... H01L 43/12 257/256 |
| 2008/0198647 A1 * | 8/2008 | Kanakasabapathy ............... H01L 27/222 365/171 |
| 2009/0130779 A1 * | 5/2009 | Li ............... H01L 43/08 438/3 |
| 2010/0176472 A1 * | 7/2010 | Shoji ............... H01L 43/08 257/421 |
| 2012/0241882 A1 * | 9/2012 | Moon ............... H01L 43/12 257/421 |
| 2013/0032775 A1 * | 2/2013 | Satoh ............... H01L 45/06 257/1 |
| 2015/0263267 A1 * | 9/2015 | Kanaya ............... H01L 21/3213 257/421 |
| 2015/0270481 A1 * | 9/2015 | Annunziata ............ H01L 43/02 257/421 |
| 2016/0005959 A1 | 1/2016 | Li et al. |
| 2016/0133828 A1 * | 5/2016 | Lu ............... H01L 43/12 257/421 |
| 2016/0351799 A1 | 12/2016 | Xue et al. |
| 2017/0018706 A1 | 1/2017 | Xue et al. |
| 2017/0125667 A1 * | 5/2017 | Annunziata ............ G11C 11/161 |
| 2017/0222136 A1 * | 8/2017 | Annunziata ............ H01L 43/08 |
| 2017/0256704 A1 | 9/2017 | Chuang et al. |
| 2017/0345869 A1 * | 11/2017 | Park ............... H01L 43/08 |
| 2018/0033957 A1 * | 2/2018 | Zhang ............... H01L 43/12 |
| 2019/0122799 A1 * | 4/2019 | Shum ............... H01F 10/3254 |
| 2020/0011943 A1 * | 1/2020 | Zimmer ............... G01R 33/093 |

\* cited by examiner

METHODS TO FORM TOP CONTACT TO A MAGNETIC TUNNEL JUNCTION

BACKGROUND

Field

Embodiments of the disclosure relate to methods for fabricating structures used in memory devices. More specifically, embodiments of the disclosure relate to methods for fabricating magnetic tunnel junction structures in memory devices.

Description of the Related Art

Magnetoresistive random access memory (MRAM) is a type of memory device containing an array of MRAM cells that store data using their resistance values instead of electronic charges. Generally, each MRAM cell includes a magnetic tunnel junction (MTJ) structure. The MTJ structure may have adjustable resistance to represent a logic state "0" or "1." The MTJ structure typically includes two ferromagnetic layers separated by a thin non-magnetic layer, e.g., a tunnel barrier layer. A top contact layer and a bottom contact layer are utilized to sandwich the MTJ structure so electric current may flow through the MTJ structure.

The layers of the MTJ structure are typically deposited sequentially as overlying blanketed films. The layers are subsequently patterned by various etching processes in which one or more layers are removed, either partially or totally, in order to form the MTJ structure. However, the etching processes can damage the MTJ structure and can lead to bad electrical contact to the top electrode.

Accordingly, an improved method for forming the MTJ structure is needed.

SUMMARY

Embodiments of the disclosure relate to methods for fabricating structures used in memory devices. More specifically, embodiments of the disclosure relate to methods for fabricating MTJ structures in memory devices. In one embodiment, a method including forming a magnetic tunnel junction structure on a first contact layer, depositing an encapsulating layer on a top and sides of the magnetic tunnel junction structure, removing the encapsulating layer disposed on the top of the magnetic tunnel junction by a chemical mechanical planarization process to expose the top of the magnetic tunnel junction structure, and depositing a second contact layer on the magnetic tunnel junction structure.

In another embodiment, a method includes forming a magnetic tunnel junction structure on a first contact layer, depositing an encapsulating layer on a top and sides of the magnetic tunnel junction structure, depositing a dielectric material on the encapsulating layer, removing the dielectric material and the encapsulating layer disposed on the top of the magnetic tunnel junction by a chemical mechanical planarization process to expose the top of the magnetic tunnel junction structure, and depositing a second contact layer on the magnetic tunnel junction structure.

In another embodiment, a method includes forming a magnetic tunnel junction structure on a first contact layer, depositing an encapsulating layer on a top and sides of the magnetic tunnel junction structure, the encapsulating layer comprising silicon carbon nitride, depositing a dielectric material on the encapsulating layer, removing a portion of the dielectric material and a portion of the encapsulating layer to form a via and a trench on top of the via, the top of the magnetic tunnel junction structure being exposed, and depositing a second contact layer in the trench and the via.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the disclosure relate to methods for fabricating structures used in memory devices. More specifically, embodiments of the disclosure relate to methods for fabricating MTJ structures in memory devices. In one embodiment, the method includes forming a MTJ structure, depositing a encapsulating layer on a top and sides of the MTJ structure, depositing a dielectric material on the encapsulating layer, removing the dielectric material and the encapsulating layer disposed on the top of the MTJ structure by a chemical mechanical planarization (CMP) process to expose the top of the MTJ structure, and depositing a contact layer on the MTJ structure. The method utilizes a CMP process to expose the top of the MTJ structure instead of an etching process, which avoids damaging the MTJ structure and leads to improved electrical contact between the MTJ structure and the contact layer.

Figure 1:
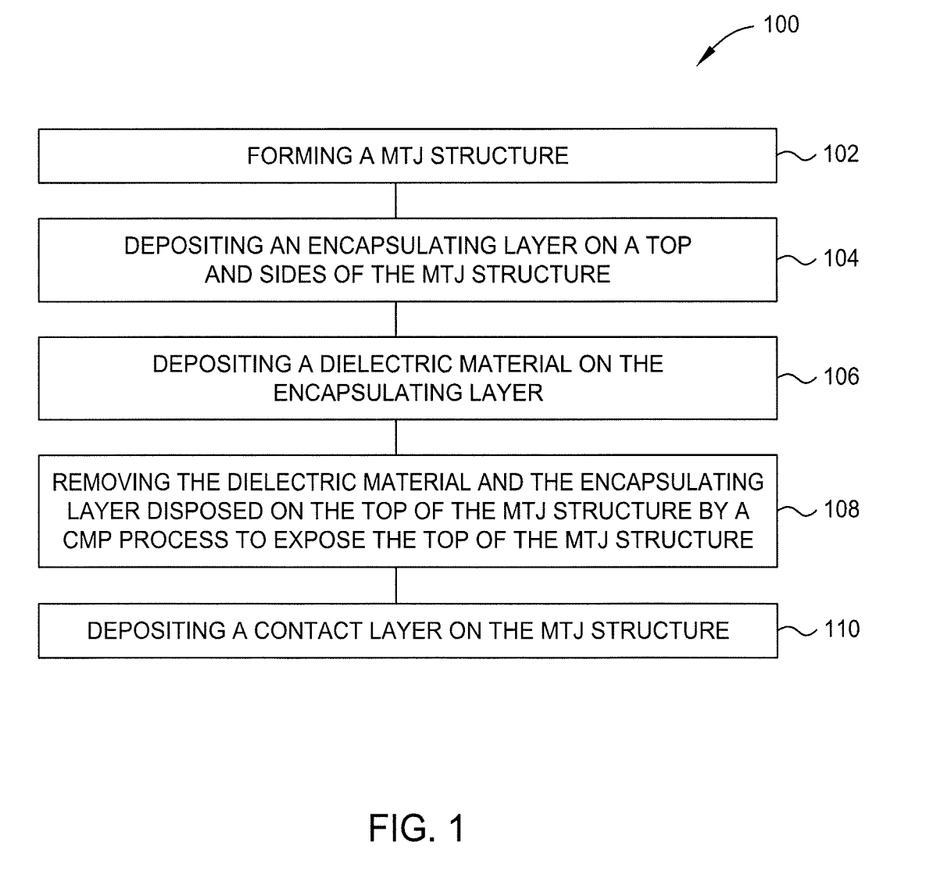
FIG. 1 is a flow diagram of a method for forming a structure.
Figure 2A:
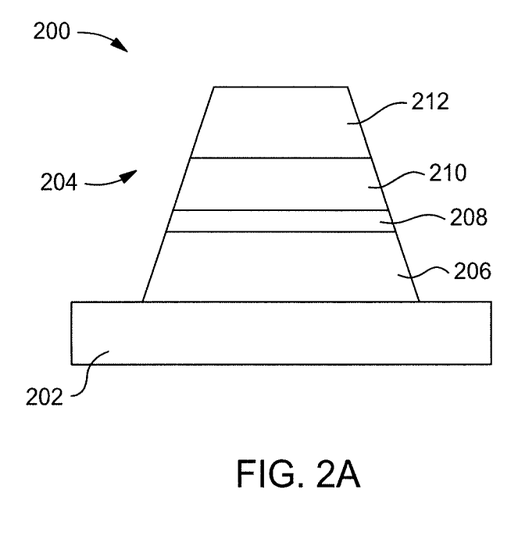
FIGS. 2A-2E illustrate schematic cross-sectional views of the structure during different stages of the method of FIG. 1.

FIG. 1 is a flow diagram of a method 100 for forming a structure 200. FIGS. 2A-2E illustrate schematic cross-sectional views of the structure 200 during different stages of the method 100 of FIG. 1. The method 100 starts at operation 102 by forming a MTJ structure 204 as shown in FIG. 2A. The MTJ structure 204 is formed on a contact layer 202. The contact layer 202 is fabricated from an electrically conductive material, such as a metal. For example, the contact layer 202 is fabricated from copper, cobalt, tungsten, tantalum, tantalum nitride, titanium, titanium nitride, tungsten nitride or other suitable material. The MTJ structure 204 includes a first magnetic layer 206, a non-magnetic layer 208 disposed over the first magnetic layer 206, a second magnetic layer 210 disposed over the non-magnetic layer 208, and a cap layer 212 disposed over the second magnetic layer 210. The first magnetic layer 206 and the second magnetic layer 210 are fabricated from a ferromagnetic material, such as a metal alloy with dopants, such as boron dopants, oxygen dopants or other suitable materials. Metal alloys may be a nickel containing material, platinum containing material, Ru containing material, a cobalt containing material, tantalum containing materials and palladium containing materials. Suitable examples of the ferromagnetic materials include Ru, Ta, Co, Pt, TaN, NiFeOx, NiFeB, CoFeOxB, CoFeB, CoFe, NiOxB, CoBOx, FeBOx, CoFeNiB, CoPt, CoPd, TaOx and the like. The non-magnetic layer 208 may be fabricated from a dielectric material for a tunnel junction magnetoresistive (TMR) sensor or from a conductive material for a giant magnetoresistive (GMR) sensor. If the MTJ structure 204 is a TMR sensor, the non-magnetic layer 208 is fabricated from MgO, $HfO_2$, $TiO_2$, $Ta_2O_5$, $Al_2O_3$, or other suitable material. If the MTJ structure 204 is a GMR sensor, the non-magnetic layer 208 is fabricated from copper, silver, molybdenum, tantalum, tungsten, or other suitable material. The cap layer 212 may be fabricated from ruthenium, iridium, tantalum, tungsten, titanium, tantalum nitride, tungsten nitride, titanium nitride, magnesium oxide, or other suitable material.

The layers 206, 208, 210, 212 of the MTJ structure 204 may be blanket deposited sequentially on the contact layer 202 and subsequently patterned by one or more etching processes. The deposition processes may be any suitable processes, such as chemical vapor deposition (CVD) process, plasma enhanced chemical vapor deposition process (PECVD) process, and/or physical vapor deposition (PVD) process. The etching processes may be any suitable etching processes, such as reactive ion etching (RIE) processes.

Figure 2B:
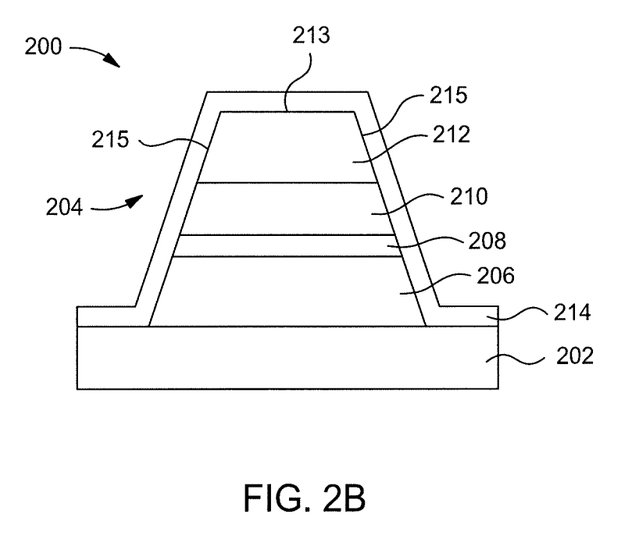

Next, at operation 104, an encapsulating layer 214 is deposited on a top 213 and sides 215 of the MTJ structure 204, as shown in FIG. 2B. The encapsulating layer 214 is fabricated from a dielectric material. The encapsulating layer 214 may be fabricated from a nitrogen containing material, carbon containing material, or oxide containing material. Suitable exemplary materials for forming the encapsulating layer 214 includes silicon nitride (SiN), silicon carbon nitride (SiCN), silicon dioxide ($SiO_2$), silicon oxynitride (SiON), silicon carbide (SiC), amorphous carbon, silicon oxycarbide (SiOC), aluminum oxide ($Al_2O_3$), aluminum nitride (AlN), and the like. The encapsulating layer 214 may be formed by an atomic layer deposition (ALD) process, and the encapsulating layer 214 may be a conformal layer.

Figure 2C:
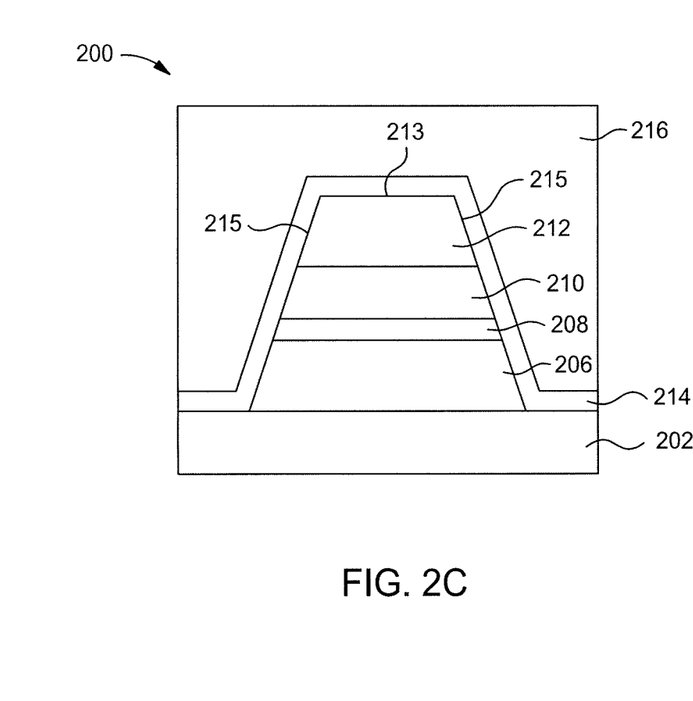
Figure 2D:
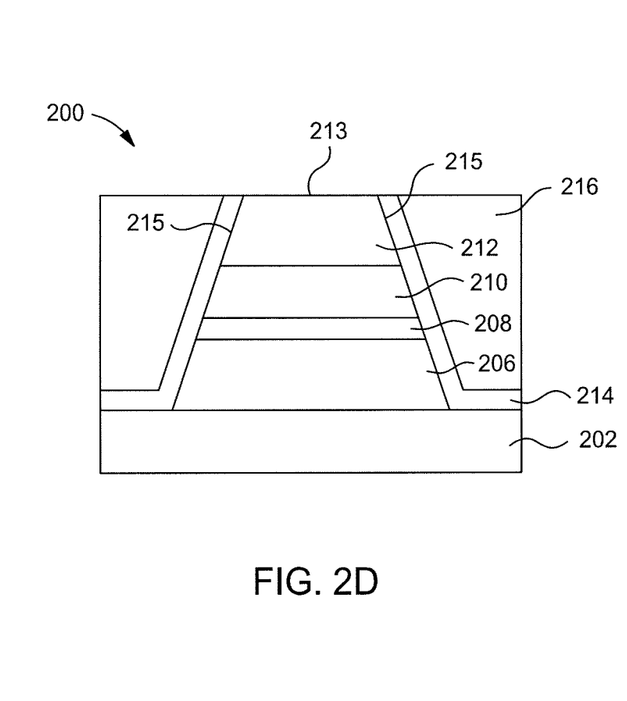

Next, at operation 106, a dielectric material 216 is deposited on the encapsulating layer 214, as shown in FIG. 2C. The dielectric material 216 may be the inter-layer dielectric (ILD) and may be fabricated from an oxide, such as silicon oxide. At operation 108, a portion of the dielectric material 216 disposed over the top 213 of the MTJ structure 204 and a portion of the encapsulating layer 214 disposed on the top 213 of the MTJ structure 204 are removed by a CMP process to expose the top 213 of the MTJ structure 204, as shown in FIG. 2D. The sides 215 of the MTJ structure 204 remain covered by the encapsulating layer 214. Unlike the conventional etching process utilized to expose the MTJ structure 204, the CMP process avoids damaging the MTJ structure 204 and leads to improved electrical contact between the MTJ structure 204 and a contact layer 218 (See FIG. 2E).

Figure 2E:
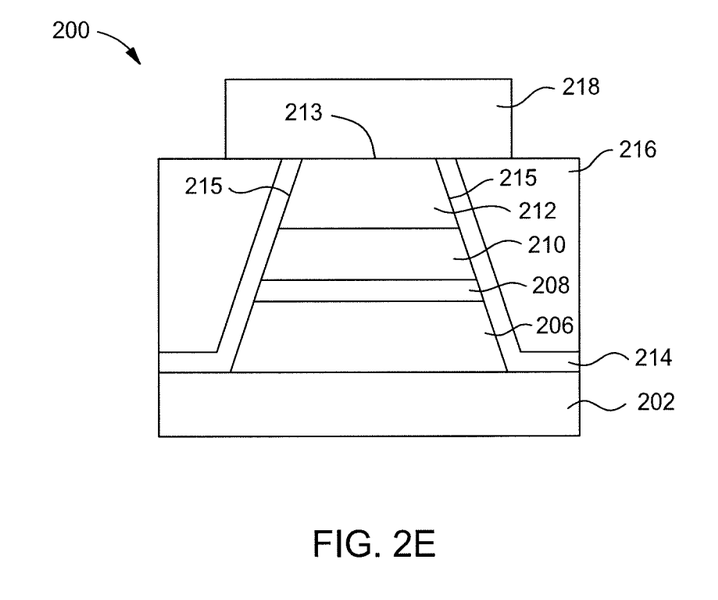

Next, at operation 110, the contact layer 218 is deposited on the top 213 of the MTJ structure 204, as shown in FIG. 2E. The contact layer 218 may be fabricated from the same material as the contact layer 202. The contact layer 218 may be disposed on the encapsulating layer 214 and the dielectric material 216. The contact layer 218 may be first blanket deposited and subsequently patterned by an etching process.

Figure 3:
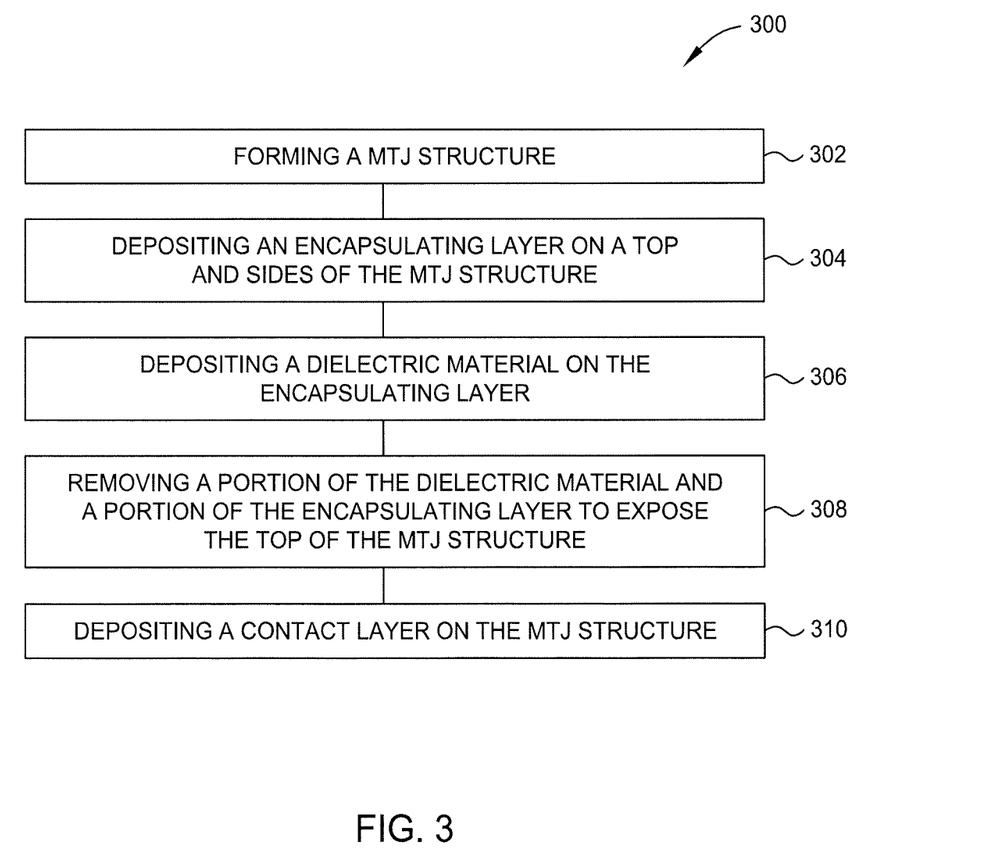
FIG. 3 is a flow diagram of a method for forming a structure.
Figure 4A:
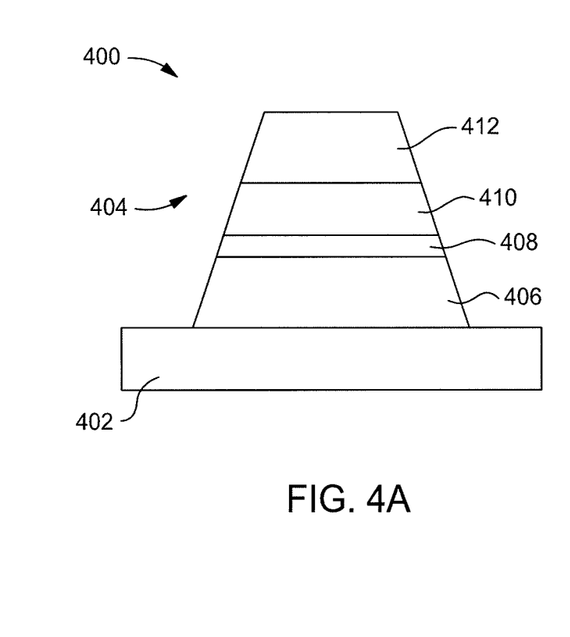
FIGS. 4A-4E illustrate schematic cross-sectional views of the structure during different stages of the method of FIG. 3.

FIG. 3 is a flow diagram of a method 300 for forming a structure 400. FIGS. 4A-4E illustrate schematic cross-sectional views of the structure 400 during different stages of the method 300 of FIG. 3. The method 300 starts at operation 302 by forming a MTJ structure 404 as shown in FIG. 4A. The MTJ structure 404 is formed on a contact layer 402. The contact layer 402 is fabricated from an electrically conductive material, such as a metal. The contact layer 402 may be fabricated from the same material as the contact layer 202 as shown in FIG. 2A. The MTJ structure 404 includes a first magnetic layer 406, a non-magnetic layer 408 disposed over the first magnetic layer 406, a second magnetic layer 410 disposed over the non-magnetic layer 408, and a cap layer 412 disposed over the second magnetic layer 410. The first magnetic layer 406 and the second magnetic layer 410 are fabricated from a ferromagnetic material, such as a metal alloy with dopants, such as boron dopants, oxygen dopants or other suitable materials. Metal alloys may be a nickel containing material, platinum containing material, Ru containing material, a cobalt containing material, tantalum containing materials and palladium containing materials. Suitable examples of the ferromagnetic materials include Ru, Ta, Co, Pt, TaN, NiFeOx, NiFeB, CoFeOxB, CoFeB, CoFe, NiOxB, CoBOx, FeBOx, CoFeNiB, CoPt, CoPd, TaOx and the like. The non-magnetic layer 408 may be fabricated from a dielectric material for a TMR sensor or from a conductive material for a GMR sensor. If the MTJ structure 404 is a TMR sensor, the non-magnetic layer 408 is fabricated from MgO, $HfO_2$, $TiO_2$, $Ta_2O_5$, $Al_2O_3$, or other suitable material. If the MTJ structure 404 is a GMR sensor, the non-magnetic layer 408 is fabricated from copper, silver, molybdenum, tantalum, tungsten, or other suitable material. The cap layer 412 may be fabricated from ruthenium, iridium, tantalum, tungsten, titanium, tantalum nitride, tungsten nitride, titanium nitride, magnesium oxide, or other suitable material.

The layers 406, 408, 410, 412 of the MTJ structure 404 may be blanket deposited sequentially on the contact layer 402 and subsequently patterned by one or more etching processes. The deposition processes may be any suitable processes, such as CVD process, PECVD process, and/or PVD process. The etching processes may be any suitable etching processes, such as RIE processes.

Figure 4B:
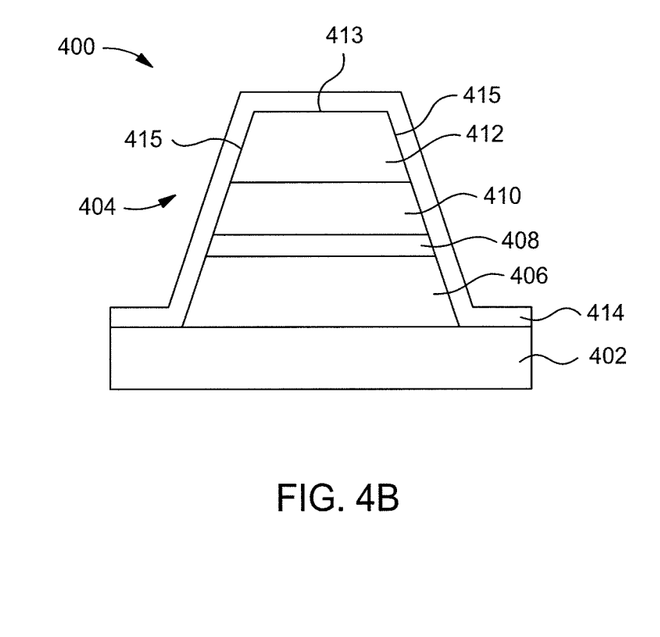
Figure 4C:
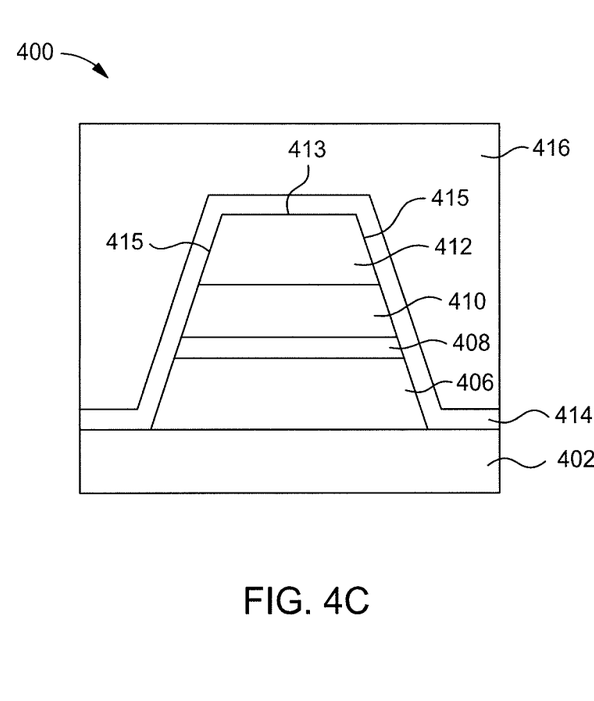

Next, at operation 304, an encapsulating layer 414 is deposited on a top 413 and sides 415 of the MTJ structure 404, as shown in FIG. 4B. The encapsulating layer 414 is fabricated from a dielectric material having a good etch selectivity against a dielectric material 416 (FIG. 4C). In one embodiment, the encapsulating layer 414 is fabricated from SiCN. The encapsulating layer 414 may be formed by an atomic layer deposition (ALD) process, and the encapsulating layer 414 may be a conformal layer.

Figure 4D:
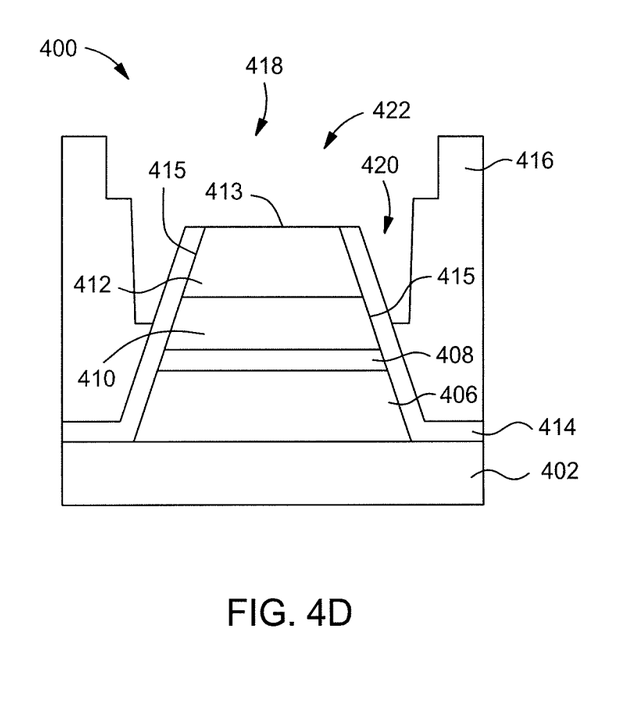

Next, at operation 306, the dielectric material 416 is deposited on the encapsulating layer 414, as shown in FIG. 4C. The dielectric material 416 may be the ILD and may be fabricated from an oxide, such as silicon oxide. The dielectric material 416 may be planarized by a CMP process. At operation 308, a portion of the dielectric material 416 disposed over the top 413 of the MTJ structure 404 and surrounding the sides 415 of the MTJ structure 404 are removed by one or more etch processes, as shown in FIG. 4D. The one or more etch processes also remove a portion of the encapsulating layer 414 disposed on the top 413 of the MTJ structure 404, and the top 413 of the MTJ structure 404 is exposed. In one embodiment, a single etch process is performed to remove the portion of the dielectric material 416 and the portion of the encapsulating layer 414, and an opening 418 is formed. In another embodiment, a dual damascene process is performed that includes a first etch process to form a via 420 and a second etch process to form a trench 422 over the via 420, as shown in FIG. 4D. The sides 415 of the MTJ structure 404 remain covered by the encapsulating layer 414. Because the encapsulating layer 414 is fabricated from a dielectric material having a good etch selectivity against the dielectric material 416 (i.e., having a much slower etch rate compared to the dielectric material 416), the MTJ structure 404 is not damaged during the etching of the dielectric material 416.

Figure 4E:
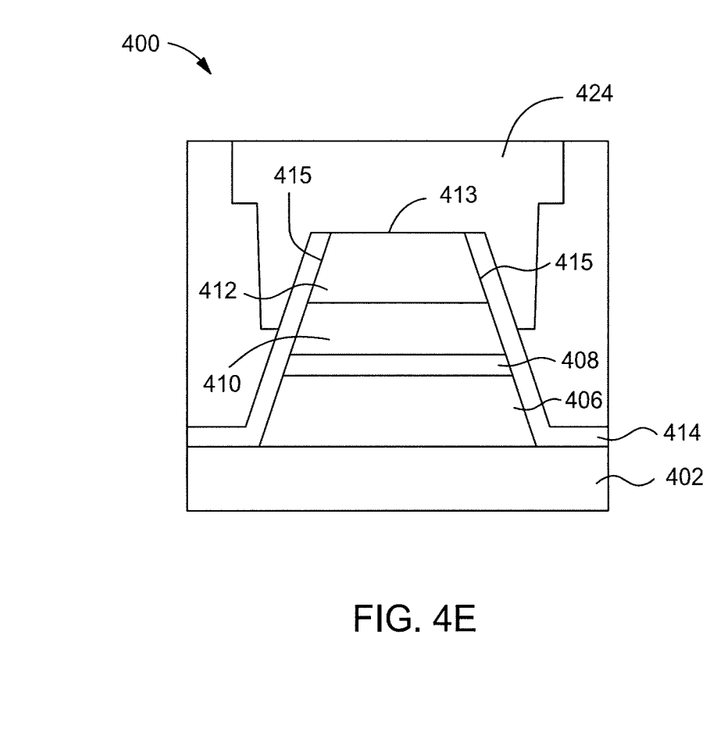

Next, at operation 310, the contact layer 424 is deposited in the opening 418 (or via 420 and trench 422) and on the top 413 of the MTJ structure 404, as shown in FIG. 4E. The contact layer 424 may be fabricated from the same material as the contact layer 402. The contact layer 424 may be formed by an electrochemical plating (ECP) process. The contact layer 424 may be planarized by a CMP process to be co-planar with the dielectric material 416.

By using a CMP process to expose the MTJ structure, the MTJ structure is not damaged. Alternatively, by using a material that has a good etch selectivity against the inter-layer dielectric as the encapsulating layer, removal of the inter-layer dielectric to expose the MTJ structure by an etch process does not damage the MTJ structure.

While the foregoing is directed to embodiments of the present disclosure, other and further embodiments of the disclosure may be devised without departing from the basic scope thereof, and the scope thereof is determined by the claims that follow.

What is claimed is:

1. A method, comprising:
    forming a magnetic tunnel junction structure on a first contact layer, wherein the magnetic tunnel junction structure comprises a first magnetic layer, a second magnetic layer, a non-magnetic layer disposed between the first magnetic layer and the second magnetic layer, and a cap layer disposed on the second magnetic layer, wherein the first magnetic layer comprises tantalum nitride and the cap layer comprises magnesium oxide, wherein the first magnetic layer, the non-magnetic layer, and the second magnetic layer are sequentially deposited and patterned by a plurality of reactive ion etching processes, and wherein the magnetic tunnel junction structure is tapered;
    depositing an encapsulating layer in a single atomic layer deposition process on a top and sides of the magnetic tunnel junction structure, wherein the encapsulating layer comprises silicon carbon nitride, wherein the encapsulating layer is in direct contact with a side of at least one of the first magnetic layer, the second magnetic layer, or the non- magnetic layer of the magnetic tunnel junction structure, wherein the encapsulating layer is in direct contact with a topmost layer of the magnetic tunnel junction structure;
    depositing a dielectric material on the encapsulating layer, the dielectric material contacting the encapsulating layer on the top and sides of the magnetic tunnel junction structure;
    in a dual damascene process, removing a portion of the dielectric material contacting the encapsulating layer from over the top and surrounding the sides of the magnetic tunnel junction structure and removing a portion of the encapsulating layer only from the top of the magnetic tunnel junction structure, wherein the top of the magnetic tunnel junction structure is exposed and a via and a trench over the via are formed, and wherein the encapsulating layer has a slower etch rate compared to the dielectric material, wherein the dual damascene process comprises, sequentially:
        performing a first etch process to form the via by etching the portion of the dielectric material surrounding the sides of the magnetic tunnel junction structure; and
        performing a second etch process to form the trench over the via by etching the portion of the dielectric material from the top of the magnetic tunnel junction structure; and
    depositing a second contact layer on the magnetic tunnel junction structure, the second contact layer comprising Ta, TaN, or TiN.

2. The method of claim 1, wherein the non-magnetic layer comprises MgO, $HfO_2$, $TiO_2$, $Ta_2O_5$, or $Al_2O_3$.

3. The method of claim 1, wherein the non-magnetic layer comprises copper, silver, molybdenum, tantalum, or tungsten.

4. The method of claim , wherein the dielectric material comprises an oxide.

5. The method of claim 1, wherein the non-magnetic layer comprises molybdenum or tungsten.

6. A method, sequentially comprising:
    forming a magnetic tunnel junction structure on a first contact layer comprising copper, wherein the magnetic tunnel junction structure comprises a magnesium oxide cap layer;
    depositing an encapsulating layer on a top and sides of the magnetic tunnel junction structure, the encapsulating layer comprising silicon carbon nitride in direct physical contact with the magnetic tunnel junction structure;
    depositing a dielectric material on the encapsulating layer, the dielectric material contacting the encapsulating layer on the top and sides of the magnetic tunnel junction structure;
    in a dual damascene process, removing a portion of the dielectric material contacting the encapsulating layer from over the top and surrounding the sides of the magnetic tunnel junction structure and removing a portion of the encapsulating layer only from the top of the magnetic tunnel junction structure, wherein the top of the magnetic tunnel junction structure is exposed and a via and a trench over the via are formed, and wherein the encapsulating layer has a slower etch rate compared to the dielectric material, wherein the dual damascene process comprises, sequentially:
        performing a first etch process to form the via by etching the portion of the dielectric material surrounding the sides of the magnetic tunnel junction structure; and
        performing a second etch process to form the trench over the via by etching the portion of the dielectric material from the top of the magnetic tunnel junction structure; and
    depositing a second contact layer comprising copper in the trench and the via.

7. The method of claim 6, wherein the magnetic tunnel junction structure comprises a first magnetic layer, a second magnetic layer, and a non-magnetic layer disposed between the first magnetic layer and the second magnetic layer.

8. The method of claim 7, wherein the non-magnetic layer comprises MgO, $HfO_2$, $TiO_2$, $Ta_2O_5$, or $Al_2O_3$.

9. The method of claim 7, wherein the non-magnetic layer comprises copper, silver, molybdenum, tantalum, or tungsten.

10. A method, sequentially comprising:

forming a magnetic tunnel junction structure on a first contact layer, wherein the magnetic tunnel junction structure comprises a cap layer;

depositing an encapsulating layer on a top and sides of the magnetic tunnel junction structure, the encapsulating layer in direct physical contact with the magnetic tunnel junction structure;

depositing a dielectric material on the encapsulating layer, the dielectric material contacting the encapsulating layer on the top and sides of the magnetic tunnel junction structure;

in a dual damascene process, removing a portion of the dielectric material contacting the encapsulating layer from over the top and surrounding the sides of the magnetic tunnel junction structure and removing a portion of the encapsulating layer only from the top of the magnetic tunnel junction structure, wherein the top of the magnetic tunnel junction structure is exposed and a via and a trench over the via are formed, and wherein the encapsulating layer has a slower etch rate compared to the dielectric material, wherein the dual damascene process comprises, sequentially:

performing a first etch process to form the via by etching the portion of the dielectric material surrounding the sides of the magnetic tunnel junction structure; and performing a second etch process to form the trench over the via by etching the portion of the dielectric material from the top of the magnetic tunnel junction structure; and depositing a second contact layer in the trench and the via.

11. The method of claim 10, wherein the magnetic tunnel junction structure comprises a first magnetic layer, a second magnetic layer, and a non-magnetic layer disposed between the first magnetic layer and the second magnetic layer.

12. The method of claim 11, wherein the non-magnetic layer comprises copper, silver, molybdenum, tantalum, tungsten, MgO, $HfO_2$, $TiO_2$, or $Al_2O_3$.

* * * * *

UNITED STATES PATENT AND TRADEMARK OFFICE
CERTIFICATE OF CORRECTION

PATENT NO. : 11,374,170 B2
APPLICATION NO. : 16/141470
DATED : June 28, 2022
INVENTOR(S) : Lin Xue et al.

It is certified that error appears in the above-identified patent and that said Letters Patent is hereby corrected as shown below:

In the Claims

In Column 6, Line 21, in Claim 4, delete "claim ," and insert -- claim 1, --.

Signed and Sealed this
Eleventh Day of October, 2022

Katherine Kelly Vidal
*Director of the United States Patent and Trademark Office*